United States Patent
Liu et al.

(10) Patent No.: US 12,494,368 B2
(45) Date of Patent: Dec. 9, 2025

(54) PHOTORESIST AND METHOD

(71) Applicant: Taiwan Semiconductor Manufacturing Co., Ltd., Hsinchu (TW)

(72) Inventors: Chih-Cheng Liu, Hsinchu (TW); Yi-Chen Kuo, Taichung (TW); Yen-Yu Chen, Taipei (TW); Jr-Hung Li, Chupei (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 714 days.

(21) Appl. No.: 17/674,575

(22) Filed: Feb. 17, 2022

(65) Prior Publication Data

US 2023/0154750 A1    May 18, 2023

Related U.S. Application Data

(60) Provisional application No. 63/278,530, filed on Nov. 12, 2021.

(51) Int. Cl.
*G03F 7/40*     (2006.01)
*H01L 21/027*   (2006.01)
*H01L 21/033*   (2006.01)

(52) U.S. Cl.
CPC ......... *H01L 21/0332* (2013.01); *G03F 7/405* (2013.01); *H01L 21/0276* (2013.01); *H01L 21/0337* (2013.01)

(58) Field of Classification Search
CPC .. H01L 21/0337; H01L 21/0332; G03F 7/405
See application file for complete search history.

(56) References Cited

U.S. PATENT DOCUMENTS 5,688,634 A    11/1997    Mixon et al.
6,100,012 A *  8/2000     Shi ................. G03F 7/38
                                            430/311

(Continued)

FOREIGN PATENT DOCUMENTS

CN    113296359 A    8/2021
CN    113376960 A    9/2021

(Continued)

OTHER PUBLICATIONS

Avdeeva, V. I. "O- and C-Heteroorganic Isomers. V. Reaction of Halogermanes with Esters of Trialkylstannylacetic Acid and Trialkylalkoxystannanes." Zhurnal Obshchei Khimii 36.9 (1966): 1679-1684 (Year: 1966).*

(Continued)

*Primary Examiner* — Mark F. Huff
*Assistant Examiner* — Christine Curiac
(74) *Attorney, Agent, or Firm* — Slater Matsil, LLP

(57) ABSTRACT

Photoresists and methods of forming and using the same are disclosed. In an embodiment, a method includes spin-on coating a first hard mask layer over a target layer; depositing a photoresist layer over the first hard mask layer using chemical vapor deposition or atomic layer deposition, the photoresist layer being deposited using one or more organometallic precursors; heating the photoresist layer to cause cross-linking between the one or more organometallic precursors; exposing the photoresist layer to patterned energy; heating the photoresist layer to cause de-crosslinking in the photoresist layer forming a de-crosslinked portion of the photoresist layer; and removing the de-crosslinked portion of the photoresist layer.

20 Claims, 9 Drawing Sheets

(56) References Cited

U.S. PATENT DOCUMENTS

| | | | |
|---|---|---|---|
| 9,540,729 B1 * | 1/2017 | Okura | C23C 16/45531 |
| 10,228,618 B2 * | 3/2019 | Meyers | G03F 7/16 |
| 2006/0199111 A1 * | 9/2006 | Shih | G03F 7/091 |
| | | | 430/327 |
| 2006/0199112 A1 | 9/2006 | Watanabe | |
| 2014/0272709 A1 * | 9/2014 | Liu | G03F 7/092 |
| | | | 430/311 |
| 2015/0056542 A1 | 2/2015 | Meyers et al. | |
| 2015/0221519 A1 * | 8/2015 | Marks | C23C 18/1612 |
| | | | 430/5 |
| 2017/0261850 A1 * | 9/2017 | Stowers | H01L 21/0337 |
| 2017/0271150 A1 | 9/2017 | Chang et al. | |
| 2020/0073238 A1 | 3/2020 | Zi et al. | |
| 2020/0199288 A1 * | 6/2020 | Jung | G03F 7/094 |
| 2020/0312662 A1 * | 10/2020 | Chang | H01L 21/0332 |
| 2020/0348591 A1 * | 11/2020 | Kim | H01L 21/0274 |
| 2021/0013034 A1 * | 1/2021 | Wu | G03F 7/0046 |
| 2021/0063876 A1 * | 3/2021 | Zi | G03F 7/16 |
| 2021/0198468 A1 | 7/2021 | Chen et al. | |
| 2021/0271166 A1 | 9/2021 | Zi et al. | |
| 2021/0364924 A1 | 11/2021 | Liu et al. | |
| 2022/0299877 A1 * | 9/2022 | Weidman | G03F 7/167 |

FOREIGN PATENT DOCUMENTS

| | | | | |
|---|---|---|---|---|
| JP | 2001174601 A | * | 6/2001 | |
| KR | 102195329 B1 | | 12/2020 | |
| KR | 20220076498 A | | 6/2022 | |
| TW | 202130648 A | | 8/2021 | |
| TW | 202132621 A | | 9/2021 | |
| WO | WO-2020041213 A1 | * | 2/2020 | H01L 21/31144 |
| WO | 2020190941 A1 | | 9/2020 | |

OTHER PUBLICATIONS

Yakubovich, A. Ya. "Synthesis of Heteroorganic Compounds of the Aliphatic Series by the Diazo Method. IV. Synthesis of Compounds of Elements of Group IV. Organotin Compounds." Zhurnal Obshchei Khimii 22 (1952): 1788-1793 (Year: 1952).*

* cited by examiner

PHOTORESIST AND METHOD

PRIORITY CLAIM AND CROSS-REFERENCE

This application claims the benefit of U.S. Provisional Application No. 63/278,530, filed on Nov. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
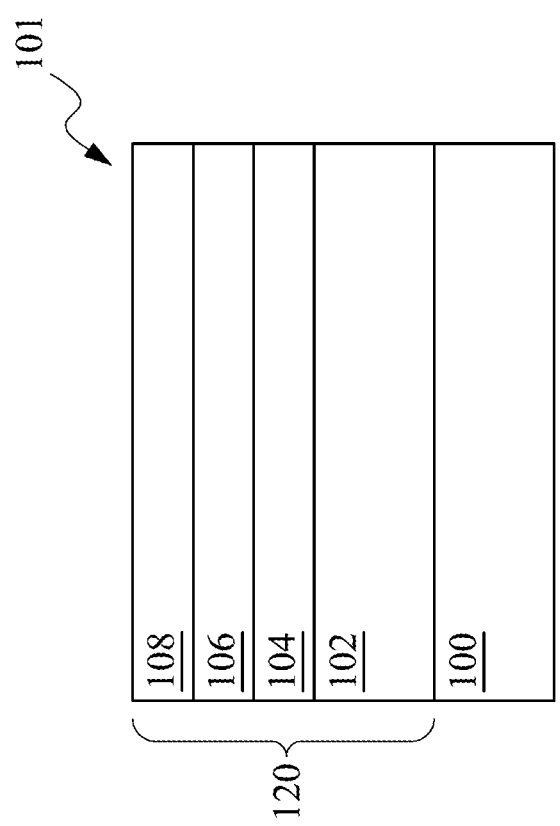
FIGS. 1 through 9 illustrate cross-sectional views of intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved photoresists, methods of forming the same, and methods of patterning target layers using the photoresists. The photoresists be molecular organometallic photoresists, which may be positive tone materials. The improved photoresists may be deposited by chemical vapor deposition (CVD), atomic layer deposition (ALD), or the like. Depositing the photoresists by CVD or ALD allows the photoresists to be deposited without using toxic organic solvents, which is a more environmentally friendly process. CVD and ALD are material-efficient processes, which reduces waste and costs. Depositing the photoresists by CVD or ALD results in the photoresists being deposited with a uniform density and a controllable film thickness, which increases lithography performance and pattern transfer, reduces device defects, and improves device performance. Molecular organometallic photoresists have good absorption of energy, such as light. This reduces the dose required to pattern the photoresists, reduces costs, and increases throughput. Molecular organometallic photoresists have good etch resistance relative to other semiconductor materials. This improves patterning of underlying layers, reduces device defects, and improves device performance.

FIGS. 1 through 9 illustrate cross-sectional views of intermediate stages in the formation of features in a target layer 102 of a semiconductor device 101, in accordance with some embodiments. The target layer 102 is a layer in which a plurality of patterns is to be formed. In some embodiments, the semiconductor device 101 may be processed as part of a larger wafer. In such embodiments, after various features of the semiconductor device 101 are formed (e.g., active devices, interconnect structures, and the like), a singulation process may be applied to scribe line regions of the wafer in order to separate individual semiconductor dies from the wafer (also referred to as singulation).

FIG. 1 illustrates a multi-layer film stack 120 formed over a semiconductor substrate 100. The multi-layer film stack 120 may include the target layer 102, a first dielectric layer 104, a first hard mask layer 106, and a second dielectric layer 108. The first dielectric layer 104, the first hard mask layer 106, and the second dielectric layer 108 may be optional layers and may be omitted in some embodiments. The first dielectric layer 104, the first hard mask layer 106, and the second dielectric layer 108 may be stacked in any desired order, may be duplicated, or may be otherwise repeated, in accordance with some embodiments.

The semiconductor substrate 100 may be formed of a semiconductor material such as silicon, doped or un-doped, or an active layer of a semiconductor-on-insulator (SOI) substrate. The semiconductor substrate 100 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like. Other substrates, such as multi-layered or gradient substrates, may also be used. Devices, such as transistors, diodes, capacitors, resistors, and the like, may be formed in and/or on an active surface of the semiconductor substrate 100. In some embodiments, the target layer 102 may be a semiconductor substrate. For example, in some embodiments, the target layer 102 may be a semiconductor substrate used to form fin field-effect transistors (FinFETs), nanostructure field effect transistors (nano-FETs), or the like. In such embodiments, the semiconductor substrate 100 may be omitted.

The target layer 102 may be a layer in which a pattern is to be formed. In some embodiments, the target layer 102 may be a conductive layer, a dielectric layer, a semiconductor layer, or the like. In embodiments in which the target layer 102 is a conductive layer, the target layer 102 may be a metal layer, a polysilicon layer, or the like. The target layer 102 may be deposited by physical vapor deposition (PVD), chemical vapor deposition (CVD) (e.g., blanket deposition or the like), or the like. The conductive layer may be patterned according to the processes described below to form metal gates (e.g., in a cut metal gate process), conductive lines, conductive vias, dummy gates (e.g. for replacement gates in FinFETs, nano-FETs, or the like), or the like.

In embodiments in which the target layer 102 is a dielectric layer, the target layer 102 may be an inter-metal dielectric layer, an inter-layer dielectric layer, a passivation layer, or the like. The target layer 102 may be a material having a low dielectric constant (e.g., a low-k material). For example, the target layer 102 may have a dielectric constant lower than 3.8, lower than 3.0, or lower than 2.5. The target layer 102 may be a material having a high dielectric constant, such as a dielectric constant higher than 3.8. The target layer 102 may be deposited by CVD, atomic layer deposition (ALD), or the like. One or more openings (such as openings 114, discussed below with respect to FIG. 6) may be patterned in the target layer 102 according to the processes described below and conductive lines, conductive vias, or the like may be formed in the openings in the target layer 102.

In embodiments in which the target layer 102 is a semiconductor material, the target layer 102 may be formed of silicon, silicon germanium, or the like. In some embodiments, the target layer 102 may be formed of a crystalline semiconductor material such as crystalline silicon, crystalline silicon carbide, crystalline silicon germanium, a crystalline III-V compound, or the like. In some embodiments, openings (such as openings 114, discussed below with respect to FIG. 6) may be patterned in the target layer 102 according to the processes described below and shallow trench isolation (STI) regions may be formed in the openings in the target layer 102. Semiconductor fins may protrude from between neighboring STI regions and source/drain regions may be formed in the semiconductor fins. The semiconductor fins may include material of the target layer 102 remaining after forming the openings in the target layer 102. Gate dielectric layers and gate electrodes may be formed over channel regions in the semiconductor fins, thereby forming semiconductor devices such as FinFETs, nano-FETs, or the like.

Although FIG. 1 illustrates the target layer 102 as being in physical contact with the semiconductor substrate 100, any number of intervening layers may be disposed between the target layer 102 and the semiconductor substrate 100. Such intervening layers may include an inter-layer dielectric (ILD) layer, which may include a low-k dielectric and may include contact plugs formed therein; other inter-metallic dielectric (IMD) layers having conductive lines and/or vias formed therein; one or more intermediary layers (e.g., etch stop layers, adhesion layers, or the like); combinations thereof; or the like. In some embodiments, an etch stop layer may be disposed directly under the target layer 102. The etch stop layer may act as a stop for an etching process subsequently performed on the target layer 102 (e.g., the etching process described below with respect to FIG. 6). The materials and processes used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like. The etch stop layer may be deposited by CVD, ALD, plasma-enhanced chemical vapor deposition (PECVD), low-pressure CVD (LPCVD), PVD, or the like.

The first dielectric layer 104 is formed over the target layer 102. The first dielectric layer 104 may be an anti-reflective coating (ARC), which may aid in the exposure and focus of overlying photoresist layers (discussed below) during patterning of the overlying photoresist layers. In some embodiments, the first dielectric layer 104 may be formed from SiON, silicon carbide, materials doped with oxygen (O) and/or nitrogen (N), or the like. In some embodiments, the first dielectric layer 104 is substantially free from nitrogen, and may be formed from an oxide. In such embodiments, the first dielectric layer 104 may be also referred to as a nitrogen-free ARC (NFARC). A material composition of the first dielectric layer 104 may be selected to prevent reflection, in some embodiments. The first dielectric layer 104 may be deposited by PECVD, high-density plasma (HDP) deposition, or the like.

The first hard mask layer 106 is formed over the first dielectric layer 104. The first hard mask layer 106 may be formed of a material that comprises a metal (e.g., titanium nitride, titanium, tantalum nitride, tantalum, a metal-doped carbide (e.g., tungsten carbide), or the like); a metalloid (e.g., silicon nitride, boron nitride, silicon carbide, or the like); an oxide (e.g., silicon dioxide ($SiO_2$), an oxide formed from tetraethylorthosilicate (TEOS), or the like); silicon, or the like. In some embodiments, a material composition of the first hard mask layer 106 may be determined to provide a high etch selectivity with an underlying layer, for example with respect to the first dielectric layer 104 and/or the target layer 102. The first hard mask layer 106 may be deposited by CVD, PVD, ALD, or the like. In subsequent processing steps, a pattern is formed on the first hard mask layer 106 using an embodiment patterning process. The first hard mask layer 106 is then used as an etching mask for etching the target layer 102, where the pattern of the first hard mask layer 106 is transferred to the target layer 102.

The second dielectric layer 108 is formed over the first hard mask layer 106. The second dielectric layer 108 may be formed from a silicon oxide material. For example, the second dielectric layer 108 may be an oxide formed from borophosphosilicate tetraethylorthosilicate (BPTEOS), un-doped TEOS, or the like. The second dielectric layer 108 may be deposited by CVD, ALD, PEALD, spin-on coating, or the like. Other processes and materials may be used. In some embodiments, the second dielectric layer 108 also acts as an anti-reflective coating. The first hard mask layer 106 and the second dielectric layer 108 may have different material compositions such that the first hard mask layer 106 and the second dielectric layer 108 can each be selectively etched. Although FIG. 1 illustrates the second dielectric layer 108 as being disposed above the first hard mask layer 106, in some embodiments, the second dielectric layer 108 may be disposed under the first hard mask layer 106.

Figure 2:
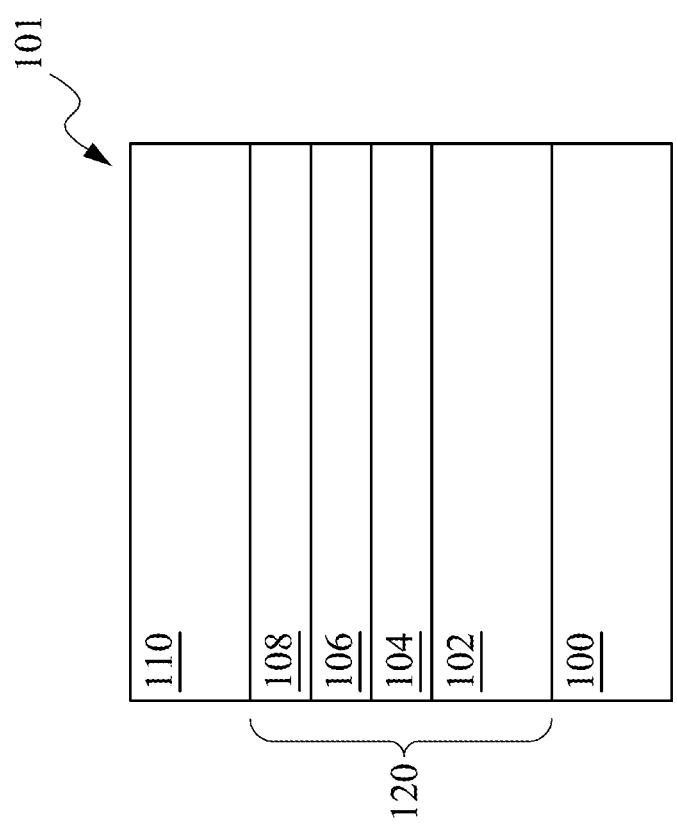

In FIG. 2, a second hard mask layer 110 is formed over the multi-layer film stack 120. The second hard mask layer 110 may be deposited by spin-on coating or the like and subsequently baked. In some embodiments, the second hard mask layer 110 may include a spin-on carbon (SOC) material, a bottom anti-reflective coating (BARC) material, or the like. The second hard mask layer 110 may include organic polymers having a high carbon content (e.g., the second hard mask layer 110 may have a carbon content from about 20 wt % to about 90 wt %). The second hard mask layer 110 may be used to increase the selectivity of a multi-layer photoresist structure (such as the multi-layer photoresist structure 122, discussed below with respect to FIG. 3) to the underlying layers of the multi-layer film stack 120. Including organic polymers having high carbon contents in the second hard mask layer 110 may increase an etch selectivity of the second hard mask layer 110 relative to underlying layers of the multi-layer film stack 120. The second hard mask layer 110 may further include photoactive compounds (PACs), such as photoacid generators (PAGs), photobase generators (PBGs), and the like. In some embodiments, the PAGs may include iodonium salts (such as tert-butylphenyliodonium perfluorooctanesulfonate (TBI-PFOS) or the like), sulfonium salts (such as triphenylsulfonium perfluorobutanesulfonate (TPS-PFBS), triphenylsulfonium trifluorosulfonate (TPS-TF), or the like), combinations thereof, or the like. The photoactive compounds may be included in the second hard mask layer 110 to aid in the de-crosslinking of a subsequently deposited photoresist layer (such as the photoresist layer 112, discussed below with respect to FIG. 3) during exposure of the photoresist layer to a patterned energy source. In some embodiments, a solvent used in the deposition of the second hard mask layer 110 may include an organic solvent, such as propylene glycol methyl ether acetate (PGMEA) or the like.

Figure 3:
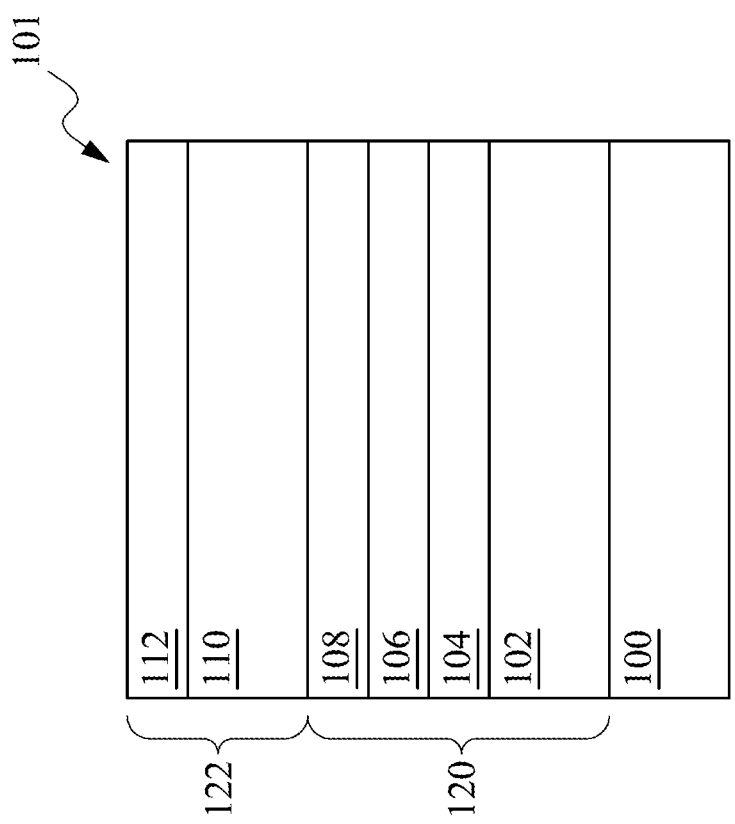

In FIG. 3, a photoresist layer 112 is formed over the second hard mask layer 110. The combination of the photoresist layer 112 and the second hard mask layer 110 may be referred to as a multi-layer photoresist structure 122. In some embodiments, the photoresist layer 112 may be formed of an organometallic compound. The photoresist layer 112 may be deposited by CVD, ALD, spin-on coating, or the like. In embodiments in which the photoresist layer 112 is deposited by CVD or ALD, the deposition may be performed at a temperature from about 100° C. to about 500° C., at a pressure from about 5 mTorr to about 10 Torr, with a plasma power less than about 1,000 W. The second photoresist layer 112 may be deposited from organometallic precursors, which may be supplied in the gas phase. The organometallic precursors may be supplied at a flowrate from about 100 sccm to about 2,000 sccm. In some embodiments, the organometallic precursors have the following general formulas: $M(CH_2COOX)_4$, $M(CH_2COOR)_4$, $M(CH=CH_2)_4$, $M(CH(CH_3)X)_4$, or $M(N=C=O)_4$. M represents a metal, which may include tin (Sn), bismuth (Bi), antimony (Sb), indium (In), tellurium (Te), or the like. X represents a halogen, such as chlorine (Cl), bromine (Br), iodine (I), or the like. R represents an alkyl group, which may be linear or branched, and may include from 1 carbon atom to 5 carbon atoms. Accordingly, the organometallic precursors may include the following structures:

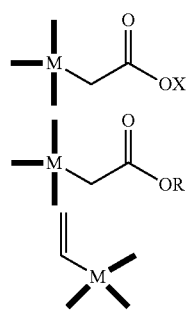

-continued

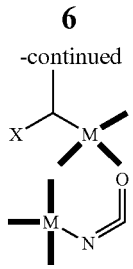

In each of the above structures, only one functional group is completely illustrated. Each structure may include four of the illustrated functional groups, with the three other functional groups being represented by the - symbol. The other functional groups represented by the - symbol are the same as the illustrated functional group in each of the above structures and throughout this application. In further embodiments, the organometallic precursors may have the general formula MxAaBb, where M represents one of the above-described metals, A and B represent any two of the above-described ligands (e.g., $CH_2COOX$, $CH_2COOR$, $CH=CH_2$, $CH(CH_3)X$, or $N=C=O$), x ranges from 1 to 2, a and b each are greater than or equal to 1, and the sum of a and b is less than or equal to 6.

The organometallic precursors may react with a co-reactant before being polymerized to form the photoresist layer 112. In some embodiments, the co-reactant may include water vapor ($H_2O$), ammonia ($NH_3$), or the like. For example, the organometallic precursors may react with the co-reactant according to the following reactions:

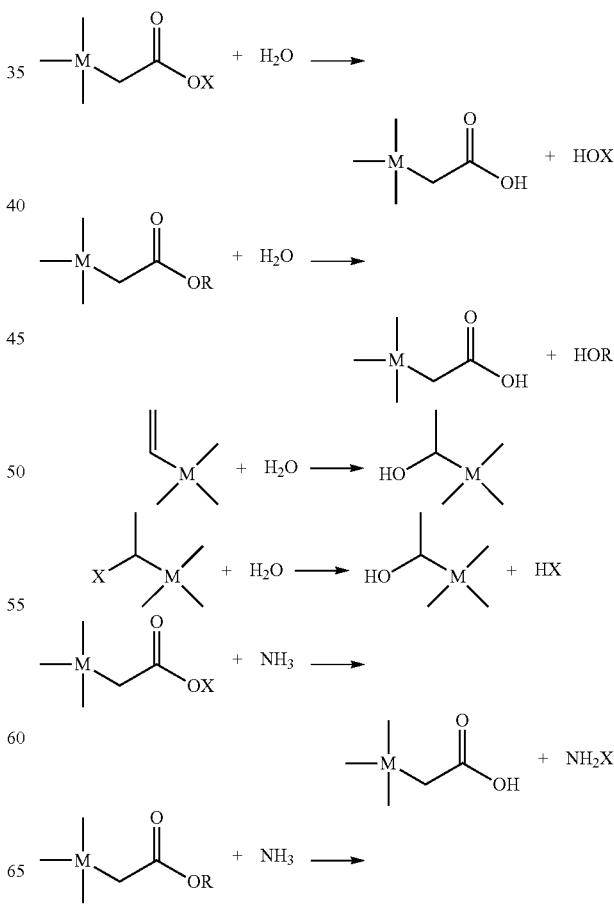

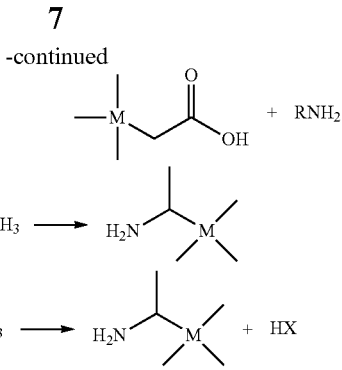

In each of the above structures, only one functional group is illustrating as reacting with each of the co-reactants. However, any number of the functional groups may react with the co-reactants.

The organometallic precursors are deposited on the second hard mask layer 110 and then undergo a post-deposit bake in order to cause cross-linking between the organometallic precursors and form the photoresist layer 112. The post-deposit bake may be performed at a temperature from about 70° C. to about 150° C., at a pressure from about 100 Torr to about 1 atm (760 Torr), and for a duration from about 20 seconds to about 10 minutes. The organometallic precursors may include at least two of the above-described structures. For example, the organometallic precursors may include M(CH$_2$COOH)$_4$ and M(CH(CH$_3$)OH)$_4$; M(CH$_2$COOH)$_4$ and M(CH(CH$_3$)NH$_2$)$_4$; M(N=C=O)$_4$ and M(CH(CH$_3$)OH)$_4$; or M(N=C=O)$_4$ and M(CH(CH$_3$)NH$_2$)$_4$. The organometallic precursors may be cross-linked to form M(CH$_2$COOH)$_3$(CH$_2$COOCHCH$_3$)M(CH(CH$_3$)OH)$_3$, M(CH$_2$COOH)$_3$(CH$_2$C=ONHCHCH$_3$)M(CH(CH$_3$)NH$_2$)$_3$, or M(N=C=O)$_3$(NHCOOCHCH$_3$)M(CH(CH$_3$)OH)$_3$. The organometallic precursors may be cross-linked according to the following reactions:

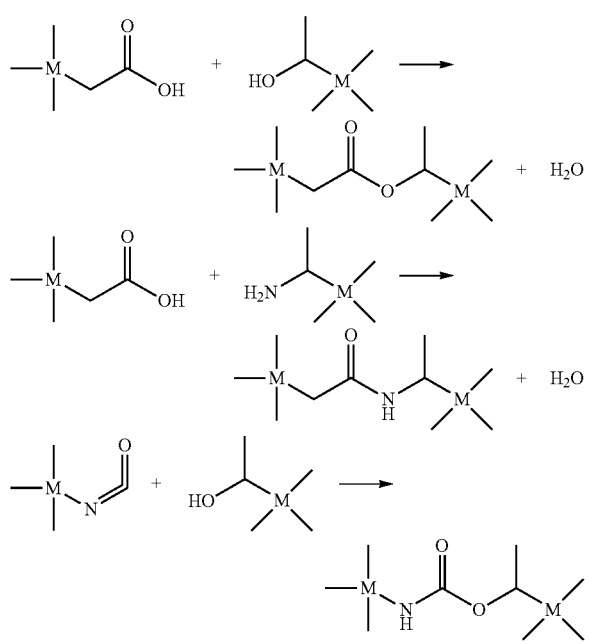

In each of the above structures, only one functional group of each organometallic precursor is illustrated as reacting with one functional group of another organometallic precursor to form a crosslinked photoresist molecule. However, any number of the functional groups from the organometallic precursors may be cross-linked to form the crosslinked photoresist molecules.

Depositing the photoresist layer 112 using CVD, ALD, or the like results in the photoresist layer 112 having a controllable film thickness. For example, the photoresist layer 112 may be deposited to a thickness ranging from about 4 nm to about 400 nm. The photoresist layer 112 may be deposited with high film uniformity, including a uniform film density, over a large area. Forming the photoresist layer 112 of the described organometallic materials allows for the photoresist layer 112 to be used to pattern smaller features, such as features having critical dimensions less than about 5 nm. As a result, the photoresist layer 112 may be used to form smaller devices with improved performance and reduced device defects. CVD and ALD are higher efficiency and more environmentally friendly than other processes used to deposit photoresists, which reduces costs, waste, and the use of harmful solvents.

In some embodiments, the photoresist layer 112 may be deposited with a gradient film density. The photoresist layer 112 may have an average film density ranging from about 2.0 g/cm$^3$ to about 3.5 g/cm$^3$. A ratio of a density of the photoresist layer 112 at an interface between the second hard mask layer 110 and the photoresist layer 112 to a density of the photoresist layer 112 at a top surface of the photoresist layer 112 opposite the second hard mask layer 110 may range from about 0.5 to about 2.0. Forming the photoresist layer 112 with a gradient film density may help to reduce defect issues, such as scum and bridging, and improve etching performance, such as reducing line width roughness (LWR) and line edge roughness (LER).

Figure 4:
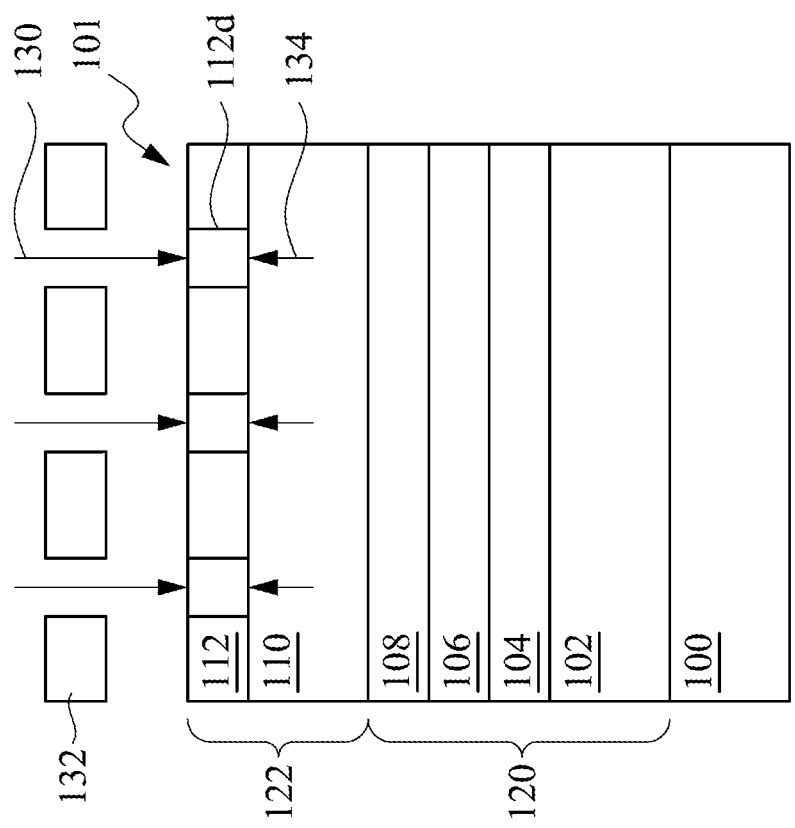

In FIG. 4, the photoresist layer 112 and the underlying second hard mask layer 110 are exposed to patterned energy 130 and a post-exposure bake (PEB) is performed to cause de-crosslinking in the photoresist layer 112, forming de-crosslinked portions 112d. The photoresist layer 112 and the underlying second hard mask layer 110 are exposed to the patterned energy 130 through a reticle 132. In some embodiments, the patterned energy 130 may include patterned light, such as ultraviolet (UV) light, extreme ultraviolet (EUV) light, or the like. Exposure of the photoactive compounds present in the second hard mask layer 110 (e.g., the photoacid generators and the photobase generators) to the patterned energy 130 causes acids and bases 134 to be generated in the second hard mask layer 110. The acids/bases 134 are then transferred to the photoresist layer 112. The acids/bases 134 may act as catalysts to cause de-crosslinking in portions of the photoresist layer 112 exposed to the patterned energy 130. In some embodiments, the acids/bases 134 may include H+ and OH− ions.

A post-exposure bake is then performed on the second hard mask layer 110 and the photoresist layer 112, which causes de-crosslinking in the portions of the photoresist layer 112 exposed to the patterned energy 130 and forms the de-crosslinked portions 112d. The acids/bases 134 transferred to the photoresist layer 112 catalyze the de-crosslinking in the exposed portions of the photoresist layer 112. The de-crosslinking in the photoresist layer 112 may proceed according to the following reaction:

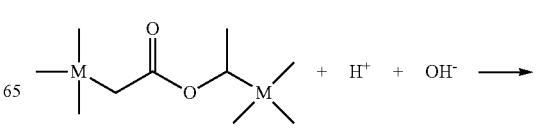

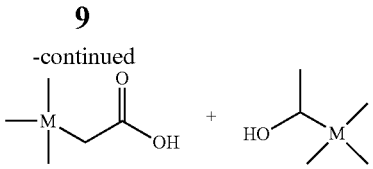

In the above structures, only one cross-link of the cross-linked photoresist molecule is illustrated as reacting with the acids/bases 134 and being de-crosslinked. However, any number of the cross-linked groups from the crosslinked photoresist molecule may be de-crosslinked. The post-exposure bake may be performed at a temperature greater than about 350° C. at ambient conditions.

Figure 5:
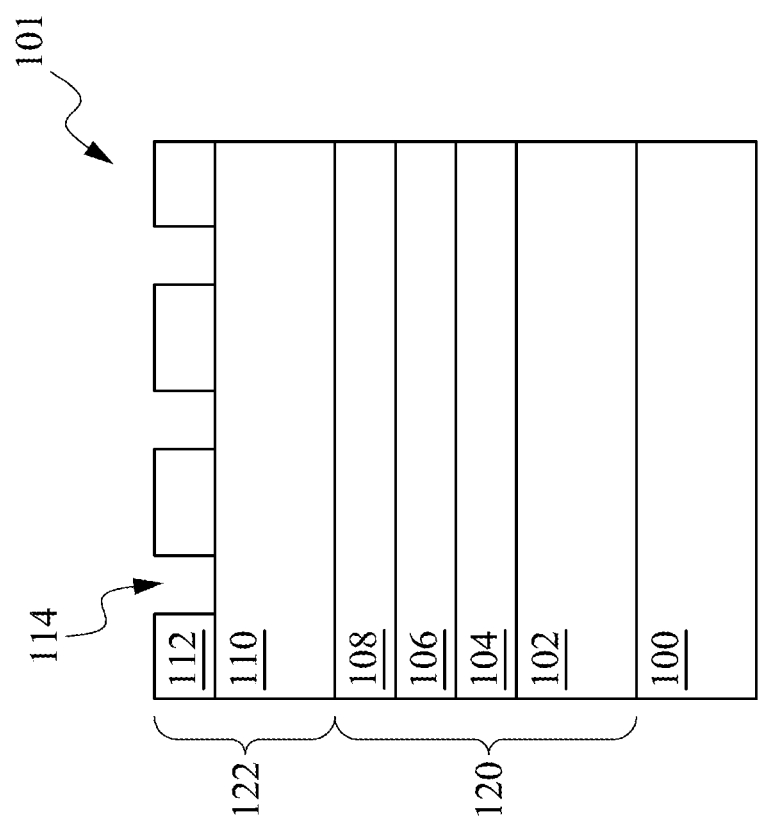

In FIG. 5, the de-crosslinked portions 112d of the photoresist layer 112 are removed forming openings 114 in the photoresist layer 112. In the illustrated embodiment, the photoresist layer 112 is a positive tone photoresist, such that the de-crosslinked portions 112d, which were exposed to the patterned energy 130, are removed. The de-crosslinked portions 112d may be removed by exposing the de-crosslinked portions 112d to a developer. The above-described materials for the photoresist layer 112 have good absorption to the patterned energy 130, such as EUV light and good etch selectivity between the unexposed portions of the photoresist layer 112 and the de-crosslinked portions 112d. This improves the exposure and development of the photoresist layer 112, results in patterns with smaller critical dimensions being formed, improves device performance, and reduces device defects. Moreover, the photoresist layer 112 is a positive tone metalorganic photoresist formed by a highly efficient deposition process, which has the potential to be used in many high-performance patterning processes.

Figure 6:
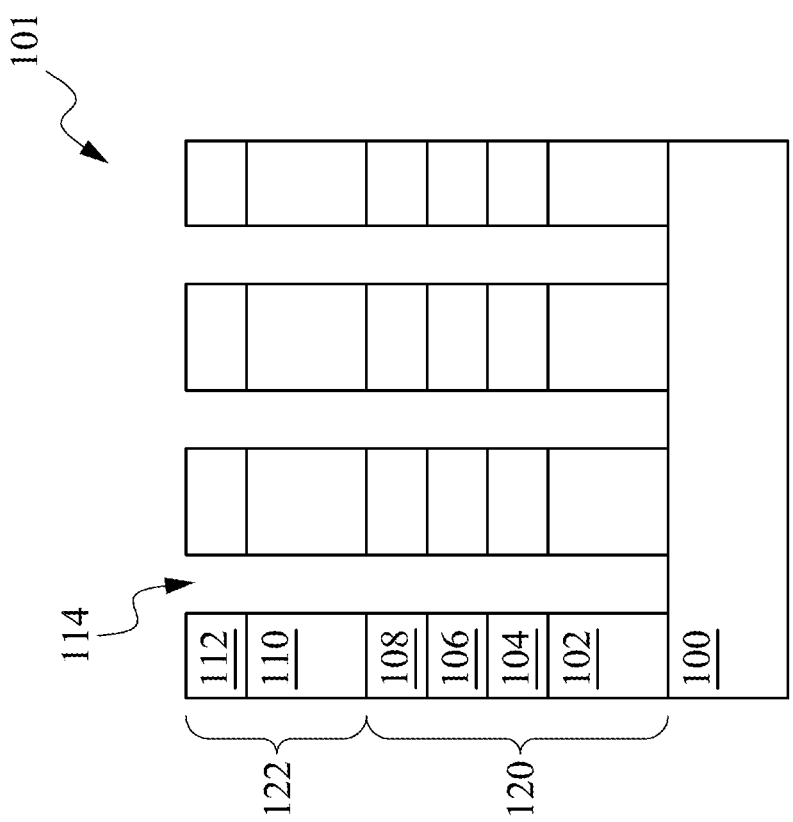

In FIG. 6, the openings 114 are extended through the second hard mask layer 110, the second dielectric layer 108, the first hard mask layer 106, the first dielectric layer 104, and the target layer 102. The second hard mask layer 110, the second dielectric layer 108, the first hard mask layer 106, the first dielectric layer 104, and the target layer 102 may be patterned using the photoresist layer 112 as a mask in one or more etching processes. The etching processes may be anisotropic, such that the openings 114 extending through the second hard mask layer 110, the second dielectric layer 108, the first hard mask layer 106, the first dielectric layer 104, and the target layer 102 have substantially the same sizes and shapes as the openings 114 extending through the photoresist layer 112. The etching processes may include wet etching processes, dry etching processes, a combination thereof, or the like. The etching processes may include processes such as reactive ion etching (RIE), neutral beam etching (NBE), or the like. Other etching techniques may be used in some embodiments.

Each of the photoresist layer 112, the second hard mask layer 110, the second dielectric layer 108, the first hard mask layer 106, and the first dielectric layer 104 is illustrated as being present over the target layer 102 after the openings 114 are extended through the second hard mask layer 110 the second dielectric layer 108, the first hard mask layer 106, the first dielectric layer 104, and the target layer 102. However, one or more of the photoresist layer 112, the second hard mask layer 110, the second dielectric layer 108, the first hard mask layer 106, and the first dielectric layer 104 may be consumed and/or removed as the openings 114 are extended through the underlying layers.

Figure 7:
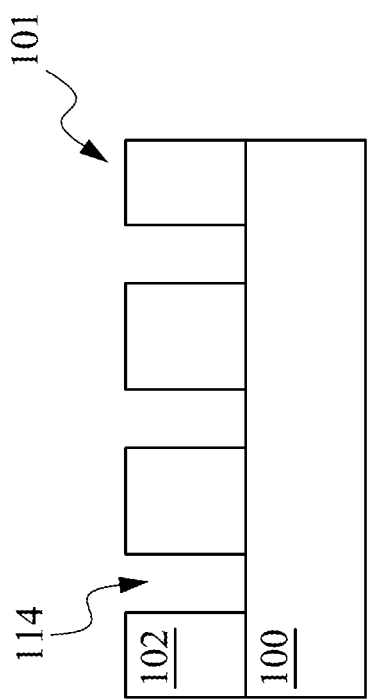

In FIG. 7, the photoresist layer 112, the second hard mask layer 110, the second dielectric layer 108, the first hard mask layer 106, and the first dielectric layer 104 are removed. The photoresist layer 112, the second hard mask layer 110, the second dielectric layer 108, the first hard mask layer 106, and the first dielectric layer 104 may be removed after the openings 114 are extended through the target layer 102. The photoresist layer 112, the second hard mask layer 110, the second dielectric layer 108, the first hard mask layer 106, and the first dielectric layer 104 may be removed by dry etching processes, wet etching processes, plasma ashing, chemical mechanical planarization (CMP) processes, combinations or multiples thereof, or the like.

Forming the photoresist layer 112 with the above-described methods and materials provides several advantages. For example, forming the photoresist layer 112 by CVD, ALD, or the like results in the photoresist layer 112 having a controllable film thickness, a high film uniformity (including a uniform film density), and a large area deposition. The photoresist layer 112 may be deposited without toxic solvents, which results in a more environmentally friendly process, and high material efficiency. The photoresist layer 112 may be an organometallic material, which has good absorption of patterned energy and good etch resistance. This allows the photoresist layer 112 to be used for reduced critical dimension etches. The above-described methods and materials may be used to improve device performance, reduce device dimensions, and reduce device defects.

Figure 8:
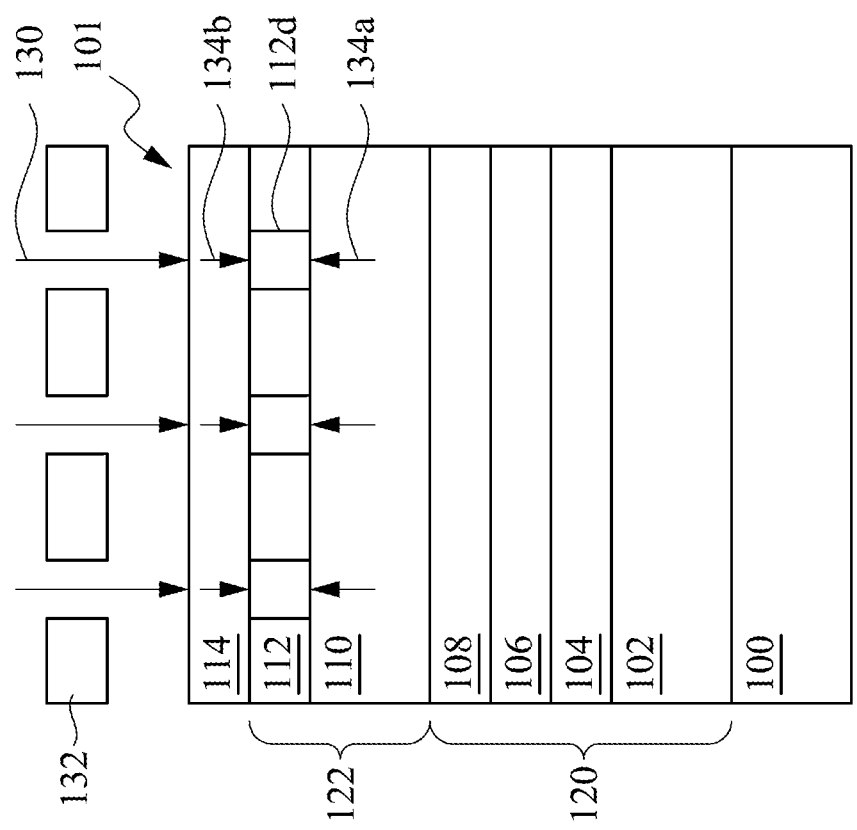

FIG. 8 illustrates an embodiment in which a third hard mask layer 116 is formed over the photoresist layer 112 before exposing the photoresist layer 112 to the patterned energy 130. The third hard mask layer 116 may be deposited over the photoresist layer 112 after the photoresist layer 112 is subjected to the post-deposit bake. The third hard mask layer 116 may be formed of materials and by methods the same as or similar to the second hard mask layer 110. For example, the third hard mask layer 116 may be deposited by spin-on coating or the like and subsequently baked. In some embodiments, the third hard mask layer 116 may include a spin-on carbon (SOC) material, a bottom anti-reflective coating (BARC) material, or the like. The third hard mask layer 116 may include organic polymers having a high carbon content (e.g., the third hard mask layer 116 may have a carbon content from about 20 wt % to about 80 wt %). The third hard mask layer 116 may be used to provide additional photoactive compounds to aid in the de-crosslinking of the photoresist layer 112. Accordingly, the third hard mask layer 116 may include photoactive compounds, such as photoacid generators, photobase generators, and the like.

Further in FIG. 8, the third hard mask layer 116, the photoresist layer 112, and the second hard mask layer 110 are exposed to the patterned energy 130 a post-exposure bake (PEB) is performed to cause de-crosslinking in the photoresist layer 112, forming de-crosslinked portions 112d. The exposure to the patterned energy 130 and the post-exposure bake may be similar to or the same as those described above with respect to FIG. 4, except that acids/bases 134a are generated in the second hard mask layer 110 and acids/bases 134b are generated in the third hard mask layer 116. Both the acids/bases 134a and the acids/bases 134b may be transferred to the photoresist layer 112 and may facilitate de-crosslinking in the photoresist layer 112 during a post-exposure bake, as described above with respect to FIG. 4. Including photoactive compounds in both the second hard mask layer 110 and the third hard mask layer 116 disposed on opposite sides of the photoresist layer 112 helps ensure adequate de-crosslinking in the photoresist layer 112, which improves etch selectivity between the de-crosslinked portions 112d and the remainder of the photoresist layer 112, which was not exposed to the patterned energy 130. This improves etch performance, reduces defects (such as scum and bridging), reduces line width roughness and line edge roughness, and allows smaller critical dimensions to be achieved with the photoresist layer 112.

Figure 9:
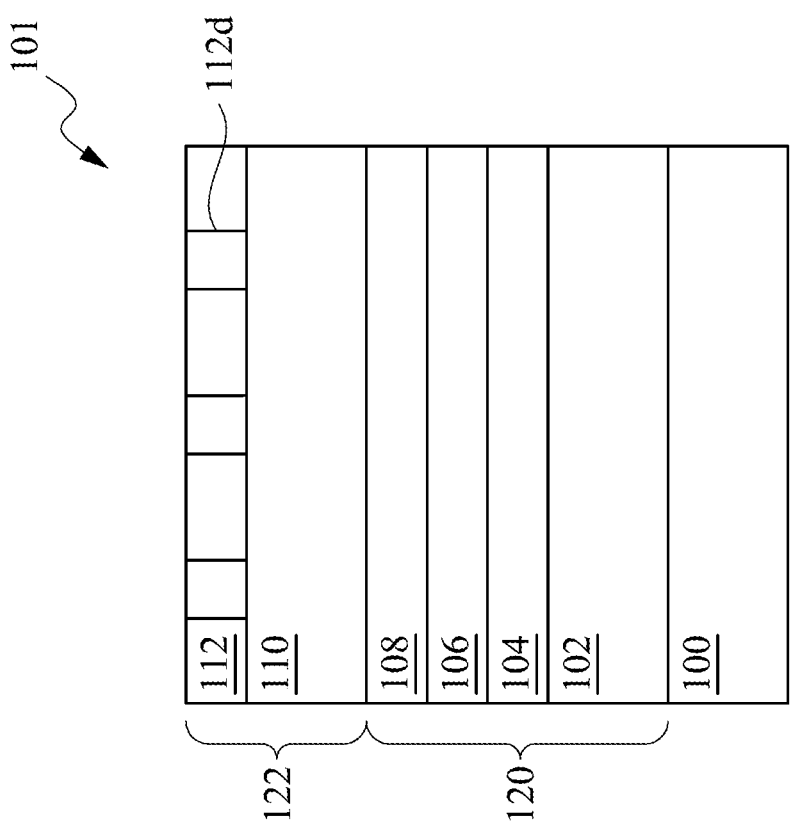

In FIG. 9, the third hard mask layer 116 is removed. The third hard mask layer 116 may be removed by dry etching, wet etching, a CMP, combinations thereof, or the like. After the third hard mask layer 116 is removed, the de-crosslinked portions 112d of the photoresist layer 112 may be removed, and the steps of FIGS. 6 and 7 may be performed as described above.

Embodiments may achieve various advantages. For example, forming the photoresist layer 112 by CVD, ALD, or the like results in the photoresist layer 112 having a controllable film thickness, a high film uniformity (including a uniform film density), and a large area deposition. The photoresist layer 112 may be deposited without toxic solvents, which results in a more environmentally friendly process, and high material efficiency. The photoresist layer 112 may be an organometallic material, which has good absorption of patterned energy and good etch resistance. This allows the photoresist layer 112 to be used for reduced critical dimension etches. The above-described methods and materials may be used to improve device performance, reduce device dimensions, and reduce device defects. Forming the third hard mask layer 116 over the photoresist layer 112 may further improve the etch performance of the photoresist layer 112, resulting in reduced device defects, lower achievable critical dimensions, and improved device performance.

In accordance with an embodiment, a method including spin-on coating a first hard mask layer over a target layer; depositing a photoresist layer over the first hard mask layer using chemical vapor deposition or atomic layer deposition, the photoresist layer being deposited using one or more organometallic precursors; heating the photoresist layer to cause cross-linking between the one or more organometallic precursors; exposing the photoresist layer to patterned energy; heating the photoresist layer to cause de-crosslinking in the photoresist layer forming a de-crosslinked portion of the photoresist layer; and removing the de-crosslinked portion of the photoresist layer. In an embodiment, the first hard mask layer includes photoactive compounds. In an embodiment, exposing the photoresist layer to the patterned energy further exposes the first hard mask layer to the patterned energy, exposing the first hard mask layer to the patterned energy generating acids or bases in the first hard mask layer, the acids or bases being transferred to the photoresist layer, and the acids or bases reacting with the photoresist layer in de-crosslinking of the photoresist layer. In an embodiment, the method further includes spin-on coating a second hard mask layer over the photoresist layer, the second hard mask layer including additional photoactive compounds. In an embodiment, the one or more organometallic precursors include a first precursor including $M(CH_2COOX)_4$ or $M(CH_2COOR)_4$ and a second precursor including $M(CH=CH_2)_4$ or $M(CH(CH_3)X)_4$, M representing a metal, X representing a halogen, and R representing an alkyl group. In an embodiment, the one or more organometallic precursors include a first precursor including $M(N=C=O)_4$ and a second precursor including $M(CH=CH_2)_4$ or $M(CH(CH_3)X)_4$, M representing a metal, X representing a halogen, and R representing an alkyl group. In an embodiment, heating the photoresist layer to cause de-crosslinking in the photoresist layer releases carbon dioxide.

In accordance with another embodiment, a method includes reacting a first precursor with a first reactant to form a first compound, the first precursor including $M(CH_2COOX)_4$ or $M(CH_2COOR)_4$, M representing a metal, X representing a halogen, and R representing an alkyl group; reacting a second precursor with the first reactant to form a second compound, the second precursor including $M(CH=CH_2)_4$ or $M(CH(CH_3)X)_4$; and cross-linking the first compound with the second compound to form a cross-linked compound. In an embodiment, the first reactant includes water. In an embodiment, the first reactant includes ammonia. In an embodiment, cross-linking the first compound with the second compound forms a positive tone photoresist. In an embodiment, the method further includes depositing the first precursor and the second precursor over a target layer by chemical vapor deposition or atomic layer deposition; and performing a post-deposition bake on the first compound and the second compound to cause the cross-linking of the first compound with the second compound. In an embodiment, the method further includes exposing the cross-linked compound to patterned energy; and performing a post-exposure bake on the cross-linked compound to cause de-crosslinking in the cross-linked compound. In an embodiment, the first precursor and the second precursor are supplied at a flowrate from 100 sccm to 2,000 sccm and the first precursor and the second precursor are deposited at a temperature from 100° C. to 500° C., a pressure ranging from 5 mTorr to 10 Torr, and with an applied plasma power of less than 1,000 W.

In accordance with yet another embodiment, a method includes forming a first hard mask layer over a target layer; and forming a cross-linked photoresist over the first hard mask layer, forming the cross-linked photoresist including cross-linking a first organometallic compound with a second organometallic compound, the first organometallic compound including $M(CH_2COOH)_4$ or $M(N=C=O)_4$, and the second organometallic compound including $M(CH(CH_3)OH)_4$ or $M(CH(CH_3)NH_2)_4$, M representing a metal, X representing a halogen. In an embodiment, the method further includes forming a second hard mask layer over the cross-linked photoresist. In an embodiment, the first hard mask layer and the second hard mask layer include photoacid generators and photobase generators. In an embodiment, the method further includes exposing the cross-linked photoresist to patterned energy and a post-exposure bake to form de-crosslinked portions from the cross-linked photoresist. In an embodiment, the method further includes exposing the cross-linked photoresist and the de-crosslinked portions to a developer solution to remove the de-crosslinked portions. In an embodiment, the metal includes tin, bismuth, antimony, indium or tellurium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
spin-on coating a first hard mask layer over a target layer;

depositing a photoresist layer over the first hard mask layer using chemical vapor deposition or atomic layer deposition, wherein the photoresist layer is deposited using one or more organometallic precursors, wherein the one or more organometallic precursors comprise a first precursor comprising $M(CH_2COOX)_4$ or $M(CH_2COOR)_4$ and a second precursor comprising $M(CH=CH_2)_4$ or $M(CH(CH)X)_4$, wherein M represents a metal, X represents a halogen, and R represents an alkyl group;

heating the photoresist layer to cause cross-linking between the one or more organometallic precursors;

exposing the photoresist layer to patterned energy;

heating the photoresist layer to cause de-crosslinking in the photoresist layer forming a de-crosslinked portion of the photoresist layer; and removing the de-crosslinked portion of the photoresist layer.

2. The method of claim 1, wherein the first hard mask layer comprises photoactive compounds.

3. The method of claim 2, wherein exposing the photoresist layer to the patterned energy further exposes the first hard mask layer to the patterned energy, wherein exposing the first hard mask layer to the patterned energy generates acids or bases in the first hard mask layer, wherein the acids or bases are transferred to the photoresist layer, and wherein the acids or bases react with the photoresist layer in de-crosslinking of the photoresist layer.

4. The method of claim 2, further comprising spin-on coating a second hard mask layer over a multi-layer film stack, the second hard mask layer comprising additional photoactive compounds.

5. The method of claim 1, wherein heating the photoresist layer to cause the de-crosslinking in the photoresist layer releases carbon dioxide.

6. A method comprising:

reacting a first precursor with a first reactant to form a first compound, the first precursor comprising $M(CH_2COOX)_4$ or $M(CH_2COOR)_4$, wherein M represents a metal, X represents a halogen, and R represents an alkyl group;

reacting a second precursor with the first reactant to form a second compound, the second precursor comprising $M(CH=CH_2)_4$ or $M(CH(CH_3)X)_4$; and cross-linking the first compound with the second compound to form a cross-linked compound.

7. The method of claim 6, wherein the first reactant comprises water.

8. The method of claim 6, wherein the first reactant comprises ammonia.

9. The method of claim 6, wherein the cross-linking the first compound with the second compound forms a positive tone photoresist.

10. The method of claim 6, further comprising:

depositing the first precursor and the second precursor over a target layer by chemical vapor deposition or atomic layer deposition; and performing a post-deposition bake on the first compound and the second compound to cause the cross-linking of the first compound with the second compound.

11. The method of claim 10, further comprising:

exposing the cross-linked compound to patterned energy; and performing a post-exposure bake on the cross-linked compound to cause de-crosslinking in the cross-linked compound.

12. The method of claim 10, wherein the first precursor and the second precursor are supplied at a flowrate from 100 sccm to 2,000 sccm and wherein the first precursor and the second precursor are deposited at a temperature from 100° C. to 500° C., a pressure ranging from 5 mTorr to 10 Torr, and with an applied plasma power of less than 1,000 W.

13. A method comprising:

forming a first hard mask layer over a target layer; and forming a cross-linked photoresist over the first hard mask layer, wherein forming the cross-linked photoresist comprises cross-linking a first organometallic compound with a second organometallic compound, wherein the first organometallic compound comprises $M(CH_2COOH)_4$ or $M(N=C=O)_4$, and wherein the second organometallic compound comprises $M(CH(CH_3)OH)_4$ or $M(CH(CH_3)NH_2)_4$, wherein M represents a metal.

14. The method of claim 13, further comprising forming a second hard mask layer over the cross-linked photoresist.

15. The method of claim 14, wherein the first hard mask layer and the second hard mask layer comprise photoacid generators and photobase generators.

16. The method of claim 13, further comprising exposing the cross-linked photoresist to patterned energy and a post-exposure bake to form de-crosslinked portions from the cross-linked photoresist.

17. The method of claim 16, further comprising exposing the cross-linked photoresist and the de-crosslinked portions to a developer solution to remove the de-crosslinked portions.

18. The method of claim 13, wherein the metal comprises tin, bismuth, antimony, indium or tellurium.

19. The method of claim 1, wherein the halogen comprises chlorine.

20. The method of claim 1, wherein the metal comprises tin, bismuth, antimony, indium or tellurium.

* * * * *